US010586785B2

(12) United States Patent
Gao et al.

(10) Patent No.: US 10,586,785 B2
(45) Date of Patent: Mar. 10, 2020

(54) EMBEDDED GRAPHITE HEAT SPREADER FOR 3DIC

(71) Applicant: Invensas Corporation, San Jose, CA (US)

(72) Inventors: Guilian Gao, San Jose, CA (US); Charles G. Woychik, San Jose, CA (US); Cyprian Emeka Uzoh, San Jose, CA (US); Liang Wang, Milpitas, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 15/927,494

(22) Filed: Mar. 21, 2018

(65) Prior Publication Data

US 2018/0219001 A1   Aug. 2, 2018

Related U.S. Application Data

(62) Division of application No. 14/639,942, filed on Mar. 5, 2015, now Pat. No. 9,953,957.

(51) Int. Cl.
*H01L 25/065* (2006.01)
*H01L 23/36* (2006.01)
(Continued)

(52) U.S. Cl.
CPC .......... *H01L 25/0657* (2013.01); *H01L 23/36* (2013.01); *H01L 23/367* (2013.01); *H01L 23/3675* (2013.01); *H01L 23/373* (2013.01); *H01L 24/00* (2013.01); *H01L 24/11* (2013.01); *H01L 24/17* (2013.01); *H01L 24/27* (2013.01); *H01L 24/32* (2013.01); *H01L 24/81* (2013.01); *H01L 24/83* (2013.01); *H01L 25/50* (2013.01); *H01L 2224/11334* (2013.01); *H01L 2224/16057* (2013.01); *H01L 2224/16145* (2013.01);
(Continued)

(58) Field of Classification Search
None
See application file for complete search history.

(56) References Cited

U.S. PATENT DOCUMENTS 8,553,420 B2   10/2013   Haba
9,281,295 B2   3/2016   Zohni
(Continued)

OTHER PUBLICATIONS

DuPont, High Performance Multi-Purpose Epoxy Based Permanent Ploymer Film, http://toshito.com/img/mg/70004198.pdf., dated no later than Mar. 31, 2014. Mar. 2014.
(Continued)

*Primary Examiner* — Long Pham (57) ABSTRACT

A device with thermal control is presented. In some embodiments, the device includes a plurality of die positioned in a stack, each die including a chip, interconnects through a thickness of the chip, metal features of electrically conductive composition connected to the interconnects on a bottom side of the chip, and adhesive or underfill layer on the bottom side of the chip. At least one thermally conducting layer, which can be a pyrolytic graphite layer, a layer formed of carbon nanotubes, or a graphene layer, is coupled between a top side of one of the plurality of die and a bottom side of an adjoining die in the stack. A heat sink can be coupled to the thermally conducting layer.

20 Claims, 12 Drawing Sheets

(51) Int. Cl.
  *H01L 23/00* (2006.01)
  *H01L 23/367* (2006.01)
  *H01L 23/373* (2006.01)
  *H01L 25/00* (2006.01)

(52) U.S. Cl.
  CPC ............ *H01L 2224/2761* (2013.01); *H01L 2224/32245* (2013.01); *H01L 2224/73204* (2013.01); *H01L 2224/81815* (2013.01); *H01L 2224/838* (2013.01); *H01L 2225/06513* (2013.01); *H01L 2225/06517* (2013.01); *H01L 2225/06541* (2013.01); *H01L 2225/06565* (2013.01); *H01L 2225/06589* (2013.01); *H01L 2924/01006* (2013.01); *H01L 2924/10253* (2013.01)

(56) References Cited

U.S. PATENT DOCUMENTS

| | | | |
|---|---|---|---|
| 2005/0155743 A1* | 7/2005 | Getz, Jr. | F28F 3/02 165/80.3 |
| 2009/0166021 A1 | 7/2009 | Slaton | |
| 2012/0038057 A1 | 2/2012 | Bartley | |
| 2012/0104592 A1* | 5/2012 | Brunnbauer | H01L 23/3675 257/712 |
| 2013/0020716 A1 | 1/2013 | Kuczynski | |
| 2014/0217616 A1 | 8/2014 | Choi | |
| 2016/0153730 A1 | 6/2016 | Park | |

OTHER PUBLICATIONS

S-Bond Technologies, Carbon-Carbide-Graphite bonding, http://s-bond.com/solutions-and-service/applications/graphite-carbon-carbide/, dated no later than Mar. 31, 2014. Mar. 2014.

Panasonic, Pyrolytic Graphite Sheet, http://www.panasonic.com/industrial/includes/pdf/PGS_Brochure.pdf, dated 2012. Jan. 1, 2012.

International Search Report issued by the European Patent Office Searching Authority for international Patent Application No. PCT/US2016/020746, dated Jun. 9, 2016. 5 pages. Jun. 9, 2016.

Written Opinion issued by the European Patent Office Searching Authority for international Patent Application No. PCT/US2016/020746, dated Jun. 9, 2016. 7 pages. Jun. 9, 2016.

X. Lu et al., "Patterning of Highly Oriented Pyrolytic Graphite by Oxygen Plasma Etching," Appl. Phys. Letts., vol. 75 Nov. 2. Published Jul. 12, 1999. Jul. 12, 1999.

* cited by examiner

EMBEDDED GRAPHITE HEAT SPREADER FOR 3DIC

CROSS REFERENCE TO RELATED APPLICATIONS

The present application is a division of U.S. patent application Ser. No. 14/639,942, filed 5 Mar. 2015, incorporated herein by reference.

BACKGROUND OF THE INVENTION

Technical Field

Embodiments of the present invention are related to embedded graphite heat spreaders for 3DIC.

Discussion of Related Art

The development of 3D integrated circuits (3DIC) has allowed for the concentration of circuitry on a circuit board. 3DICs are formed by stacking two or more IC chips and electrically interconnecting the chips to function as a single integrated circuit. The 3DIC is packaged and mounted on a circuit board.

However, thermal management in a 3DIC remains challenging. Heat can build up on individual ICs in the 3DIC and not be efficiently transferred from the 3DIC. The resulting overheating of ICs and localized hot-spots can degrade the performance and lifetime of the 3DIC and, in some cases, may lead to catastrophic failure of the 3DIC.

Therefore, there is a need to develop a better system for managing heat in a 3D Integrated Circuit.

SUMMARY

In accordance with aspects of the present invention, a device with good thermal control is presented. A device according to some embodiments includes a plurality of die positioned in a stack, each die including a chip, interconnects through a thickness of the chip, with metal features of electrically conductive composition connected to the interconnects on a bottom side of the chip, and adhesive or underfill layer on the bottom side of the chip; at least one pyrolytic graphite layer coupled between a top side of one of the plurality of die and a bottom side of an adjoining die in the stack; and a heat sink coupled to the pyrolytic graphite layer.

A method of forming a 3DIC device according to some embodiments includes forming a plurality of die, each of the die with a pyrolytic graphite sheet on a top side of a silicon chip; stacking the plurality of die to form a stack; mounting the stack of the plurality of die onto a substrate; and mounting a heat sink to the stack of the plurality of die opposite the substrate.

These and other embodiments are further discussed below with respect to the following figures.

DETAILED DESCRIPTION

In the following description, specific details are set forth describing some embodiments of the present invention. It will be apparent, however, to one skilled in the art that some embodiments may be practiced without some or all of these specific details. The specific embodiments disclosed herein are meant to be illustrative but not limiting. One skilled in the art may realize other elements that, although not specifically described here, are within the scope and the spirit of this disclosure.

This description and the accompanying drawings that illustrate inventive aspects and embodiments should not be taken as limiting—the claims define the protected invention. Various mechanical, compositional, structural, and operational changes may be made without departing from the spirit and scope of this description and the claims. In some instances, well-known structures and techniques have not been shown or described in detail in order not to obscure the invention.

Additionally, the drawings are not to scale. Relative sizes of components are for illustrative purposes only and do not reflect the actual sizes that may occur in any actual embodiment of the invention. Like numbers in two or more figures represent the same or similar elements.

The singular forms "a", "an", and "the" are intended to include the plural forms as well, unless the context indicates otherwise. And, the terms "comprises", "comprising", "includes", and the like specify the presence of stated features, steps, operations, elements, and/or components but do not preclude the presence or addition of one or more other features, steps, operations, elements, components, and/or groups. Components described as coupled may be electrically or mechanically directly coupled, or they may be indirectly coupled via one or more intermediate components.

Elements and their associated aspects that are described in detail with reference to one embodiment may, whenever practical, be included in other embodiments in which they are not specifically shown or described. For example, if an element is described in detail with reference to one embodiment and is not described with reference to a second embodiment, the element may nevertheless be claimed as included in the second embodiment.

In some embodiments, a 3DIC is formed using a thermally conducting layer in contact with a substrate. The substrate can be, for example, a non-semiconducting body, which may be formed of glass, glass ceramic material, or a high performance composite material, or can be a semiconducting medium such as a silicon chip as in the stack of silicon chips that form the 3DIC. The thermally conducting layer can be any material that is thermally conducting in a plane parallel to the layer. For example, the thermally conducting layer can be a pyrolytic graphite sheet, can be formed of carbon nanotubes formed parallel to the layer surfaces, can be formed of graphene, or formed of another material with similar properties.

A pyrolytic graphite layer, which may be formed of multiple individual sheets of pyrolytic graphite, exhibits an in-plane thermal conductivity that is 2-5 times that of bulk copper and up to 20 times that of small copper interconnects. The thermal conductivity of bulk copper is 385 W/m·K. The thermal conductivity of pyrolytic graphite layer can be as high as 1950 W/m·K. As is understood, the high in-plane thermal conductivity is due primarily to the covalent sp2 bonding between the carbon atoms in the same sheet. When metalized and soldered to thermal vias in a 3DIC stack, the high in-plane thermal conductivity provides a very effective heat dissipation mechanism, spreading heat evenly throughout the stack and substantially lowering the number and severity of hot spots throughout the stack.

Figure 1:
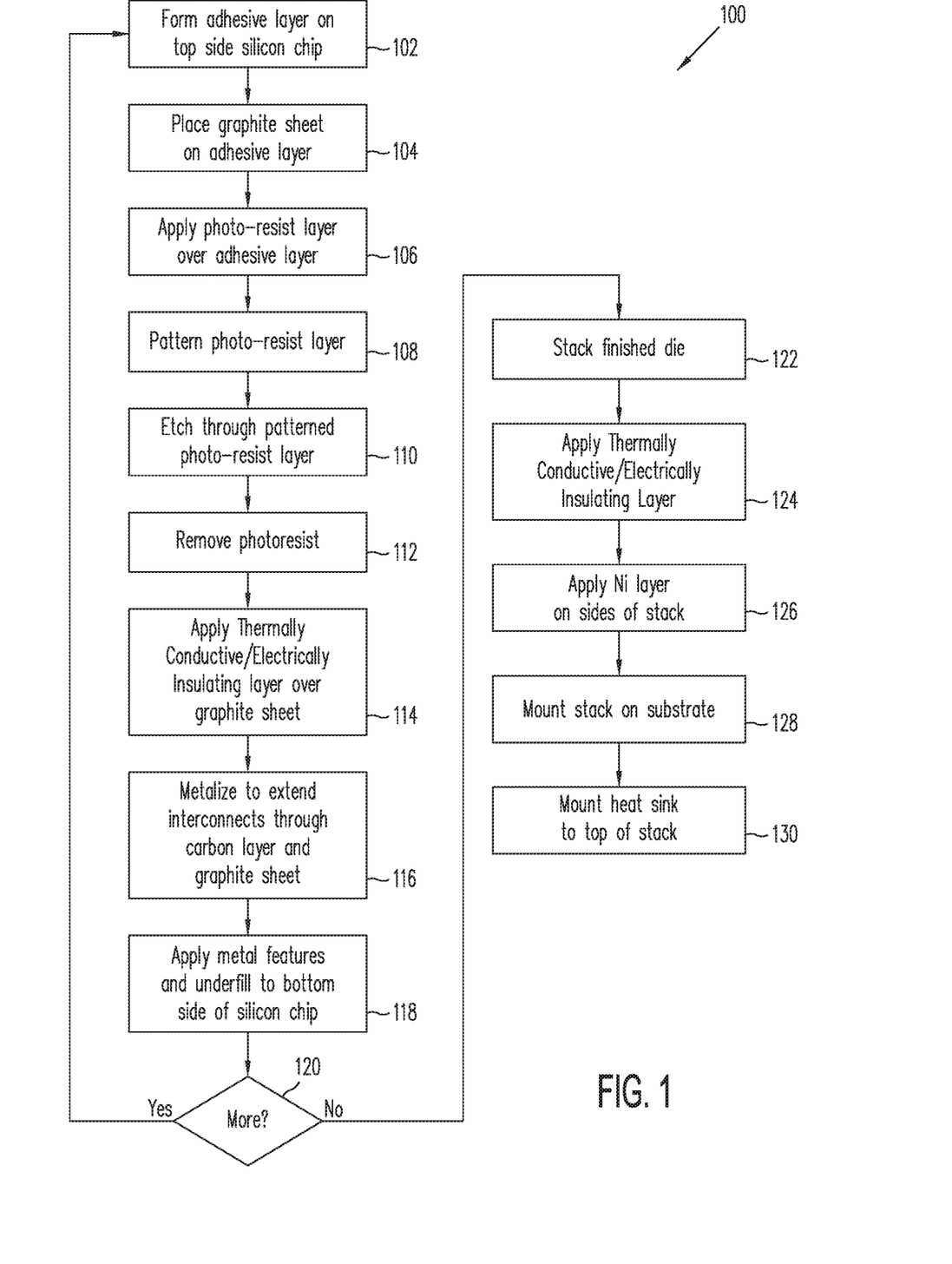
FIG. 1 illustrates a process of forming a 3DIC according to some embodiments of the present invention.
Figure 2A:
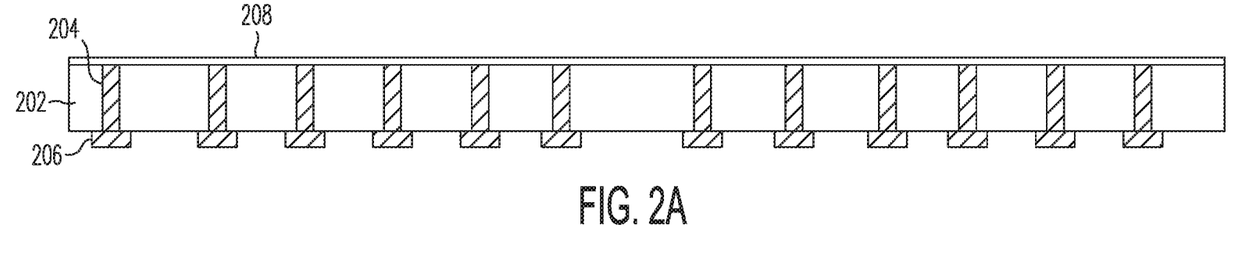
FIGS. 2A through 2G illustrate graphically the process of producing a 3DIC illustrated in FIG. 1.

FIG. 1 illustrates an example process 100 for forming a 3DIC 240 according to some embodiments of the present invention. FIGS. 2A through 2G illustrate graphically the process illustrated in FIG. 1. As shown in FIG. 1 and illustrated in FIG. 2A, step 102 is to form an adhesive layer 208 on a top side of a substrate or chip 202, which can be a silicon chip or wafer. As shown in FIG. 2A, chip 202 can include metallized interconnects 204 that pass through the thickness of chip 202 and metal features 206 of electrically conductive composition can be applied to interconnects 204 on a bottom side of chip 202, although the metallization forming interconnects 204 through chip 202 and addition of features 206 can occur at a later point in process 100. Metal features 206 can, for example, be solder balls, solder caps, or pads (e.g. Ni/Au pads). In some embodiments, adhesive layer 208 can be applied by spin coating. In some embodiments, additional wiring features may be present on the substrate and the wiring features may comprise of back end-of-line (BEOL) or redistribution layer (RDL) elements or passive elements.

Figure 2B:
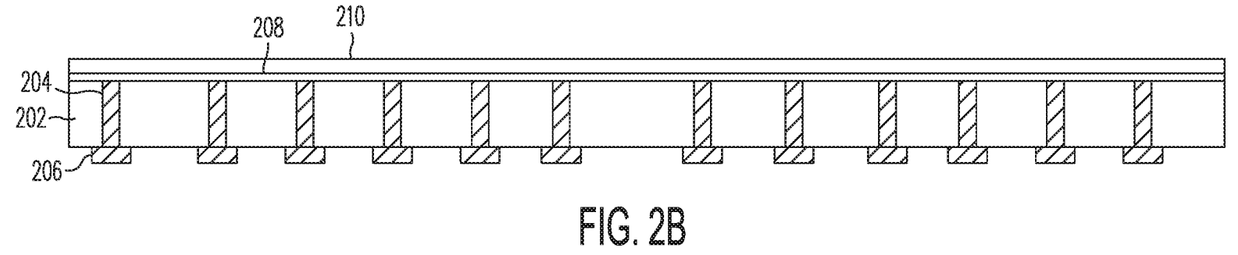

In step 104, and as shown in FIG. 2B, a thermally conducting layer 210 is attached and secured over the thin adhesive layer 208. In some embodiments, adhesive layer 208 can be of any thickness, but in some embodiments is less than 1 um in thickness. Adhesive layer 208 thereby bonds thermally conducting layer 210 to chip 202. In some embodiments, the thermally conducting layers 210 may be secured to the substrate chip 202 by other means, for example Van der Waals forces, and thermally bonded to chip 202 by other known methods.

Thermally conducting layer 210 can be any material that thermally transmits in a plane of the layer. For example, thermally conducting layer 210 can be formed of metal conductors, carbon nanotubes oriented in parallel with the layer surfaces, graphene, or may be pyrolytic graphite. In some embodiments, thermally conducting layer 210 pyrolytic graphitic layer can include one or more layers of individual graphite sheets and has a thickness of about 1 μm to about 500 μm. In process 100, thermally conducting layer 210 is patterned at a later step and therefore may be applied as a continuous whole layer.

Figure 2C:
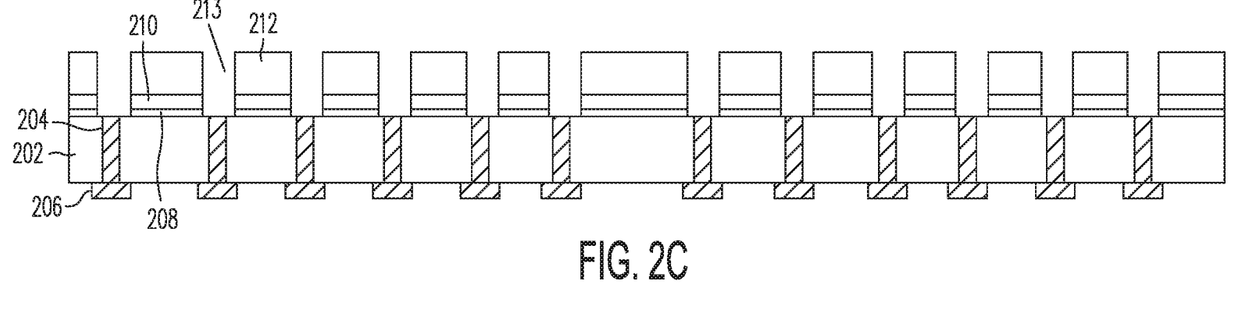

In step 106, and shown in FIG. 2C, a photo-resist layer 212 is applied over graphite sheet 210. Photo-resist 212 layer may be applied using spin coating. In step 108, and shown in FIG. 2C, photo-resist layer 212 is patterned. In step 110 an etching process is applied to form vias 213, as shown in FIG. 2C, through to the surface of chip 202. Vias 213 align with interconnects 204. In step 112, the photo-resist layer 212 is removed.

Figure 2D:
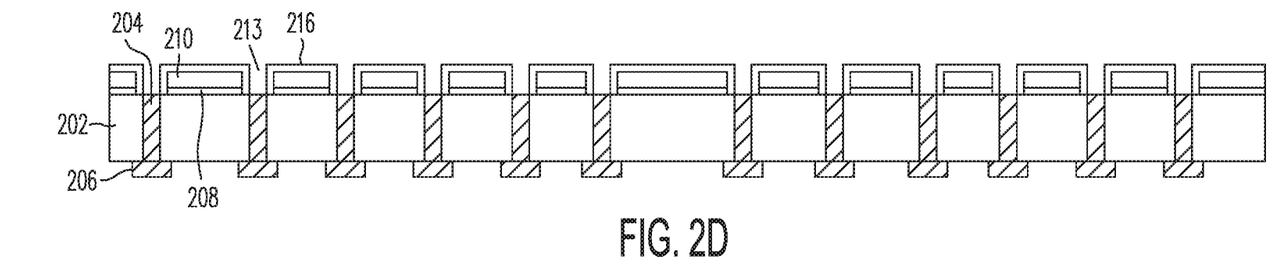
Figure 2E:
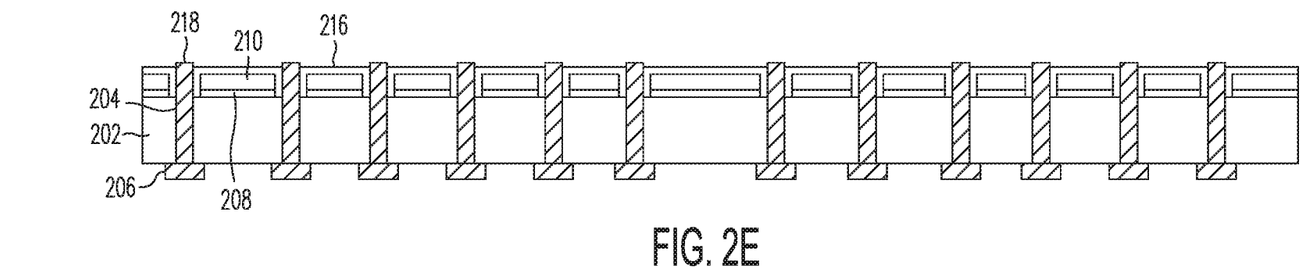

In step 114, as shown in FIG. 2D, an electrically insulating but thermally conducting layer 216 is applied. Layer 216 can be a diamond-like carbon layer, which provides an electrically insulating layer with a large thermal conductivity. In step 116, metallization is applied to extend interconnects 204 through layer 216, as is illustrated in FIG. 2E at 218. As is shown in FIG. 2E, layer 216 at least partially insulates interconnects 204 in the area above the top surface of silicon chip 202.

Figure 2F:
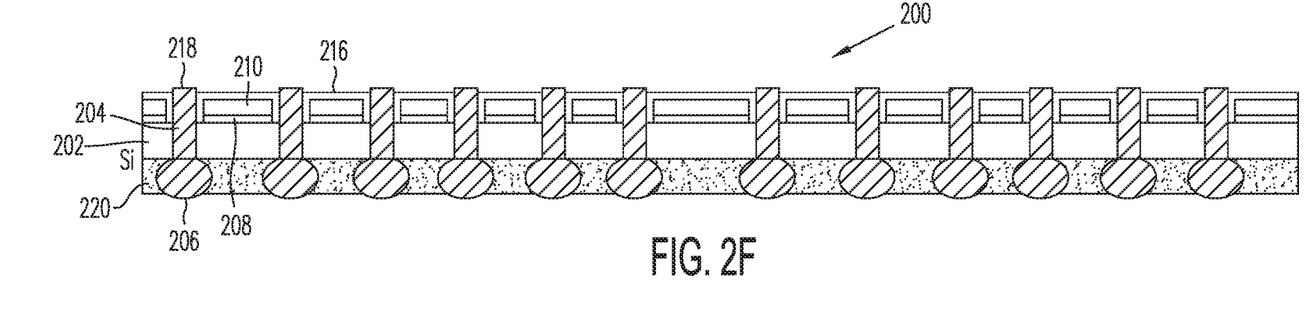

As illustrated in FIG. 2F, in step 118, features 206 can be attached to interconnects on the bottom of chip 202 (if this has not been previously done) and B-stage chip level underfill 220 is applied on the side of features 206. Other joints such as solder capped Cu pillar or direct Cu—Cu bond or joints of malleable metal/alloy or other types of conductive materials can also be used instead of solder ball 206.

Figure 2G:
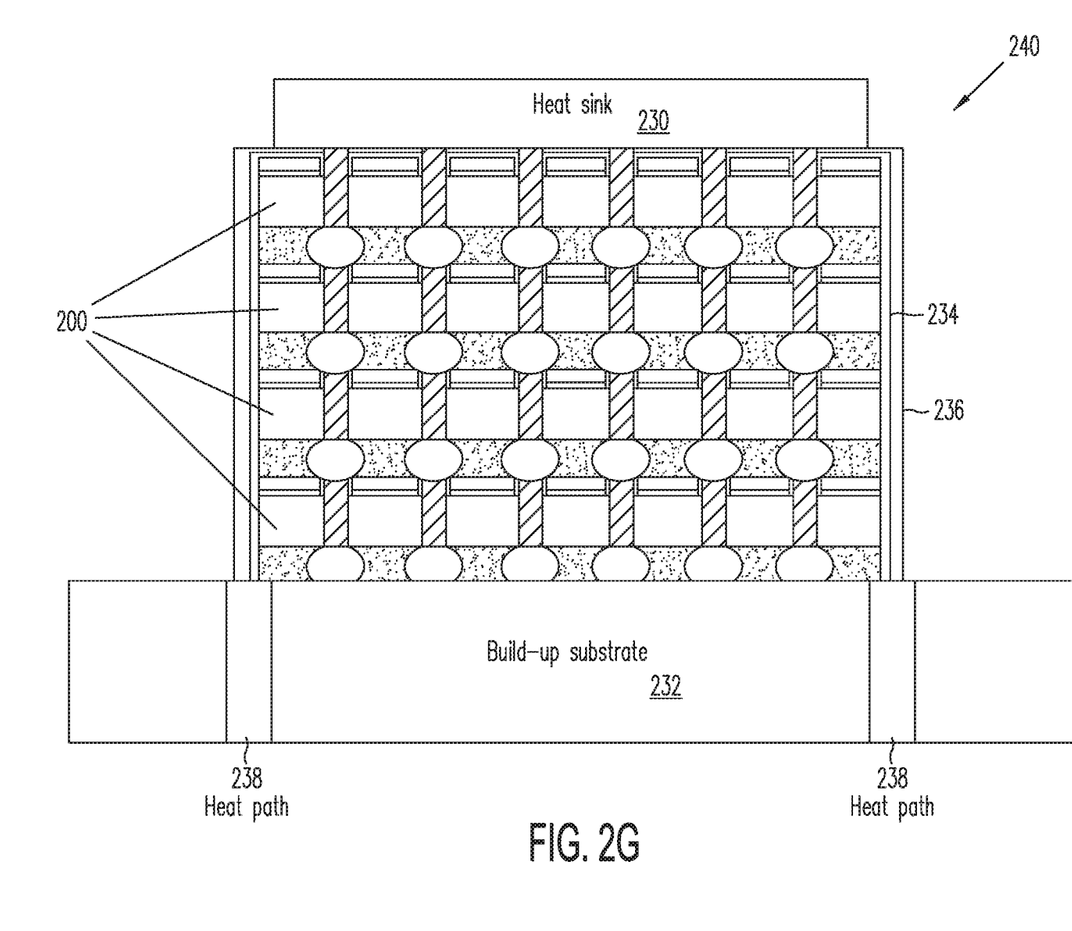

At this point a die 200 as shown in FIG. 2F is formed. In step 120, if there are more dies 200 to prepare, process 100 returns to step 102. If the process 100 is performed at the wafer level, the dies may then be diced from one another. Then, dies 200 are stacked by aligning the metallic features 206 of a higher die 200 to the top of interconnects 204 in a lower die 200 in step 122. As shown in FIG. 2G, a bottom die 200 has exposed metallic features 206 while a top die 200 has exposed interconnects 204 at the top of the silicon chip. Electrical conductivity is therefore made through the stacked die structure formed by stacking a plurality of die 200.

FIG. 2G illustrated the finished 3DIC device 240. As shown in FIG. 2G, several device structures 200 are stacked on a substrate 232 such that interconnects 204 are coupled in step 122. Once device structures 200 are stacked, thermally conductive and electrically insulating layer such as diamond-like carbon layer 234 is deposited on the edges of the stack of dies 200, contacting each of thermally conducting layer 210, in step 124. Layer 234, as is carbon layer 216, can be a diamond-like structure that is electrically insulating while having high thermal conductivity. In step 126, an electroless layer 236, for example a metal layer of nickel 236 can be deposited over layer 234, which can provide further heat dissipation and may also provide some electrostatic discharge (ESD) protection. In step 128, the stack of dies 200 can be mounted on a substrate 232 such that nickel layer 236 and carbon layer 234 can be in thermal contact with heat paths 238 formed in substrate 232. Further, in step 130, a heat sink 230 can be placed in contact with carbon layer 216 of the top-most device structure 200, the device structure 200 opposite substrate 232.

Figure 4:
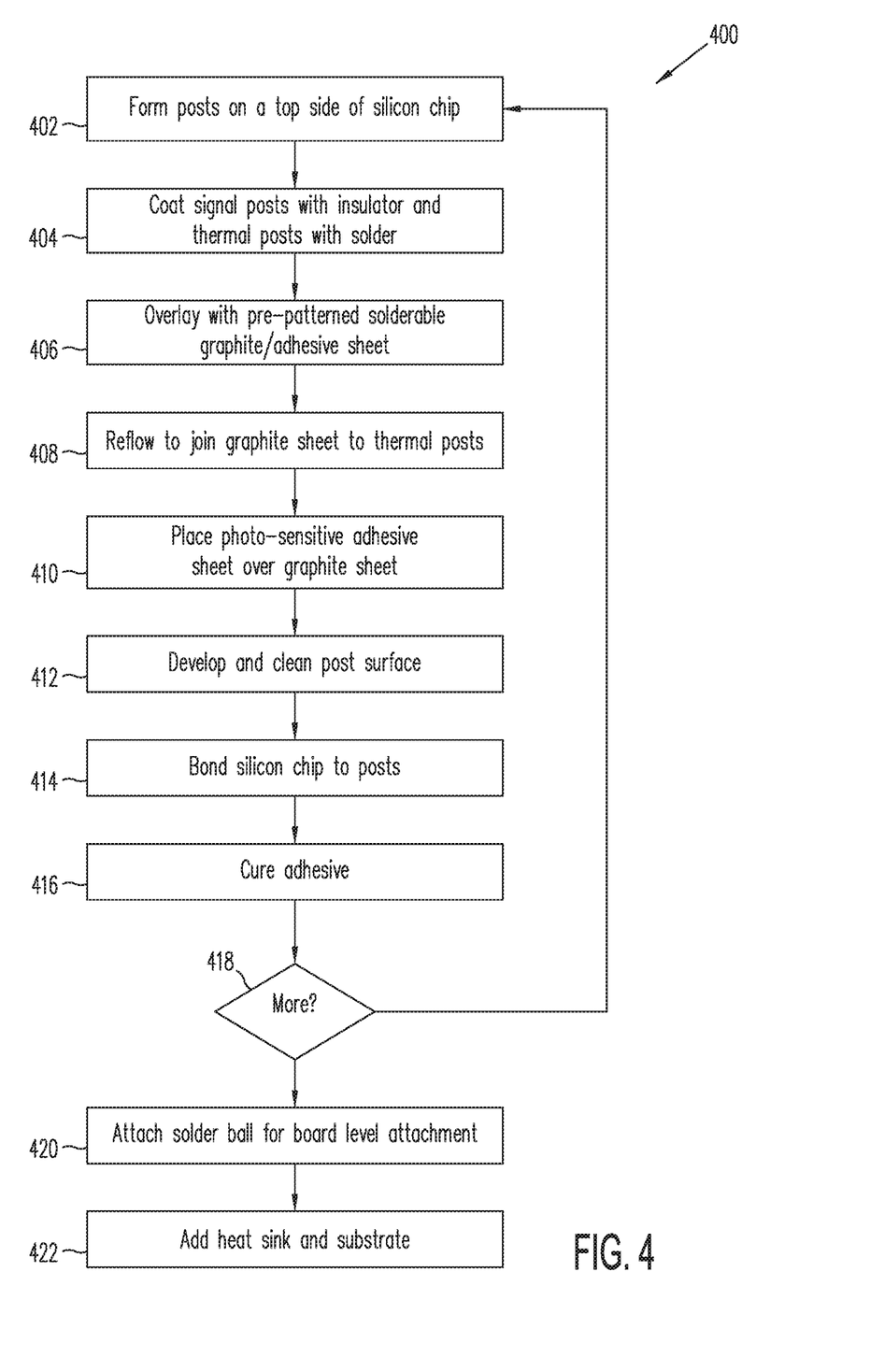
FIG. 4 illustrates another process for forming a 3DIC according to some embodiments of the present invention.
Figure 5A:
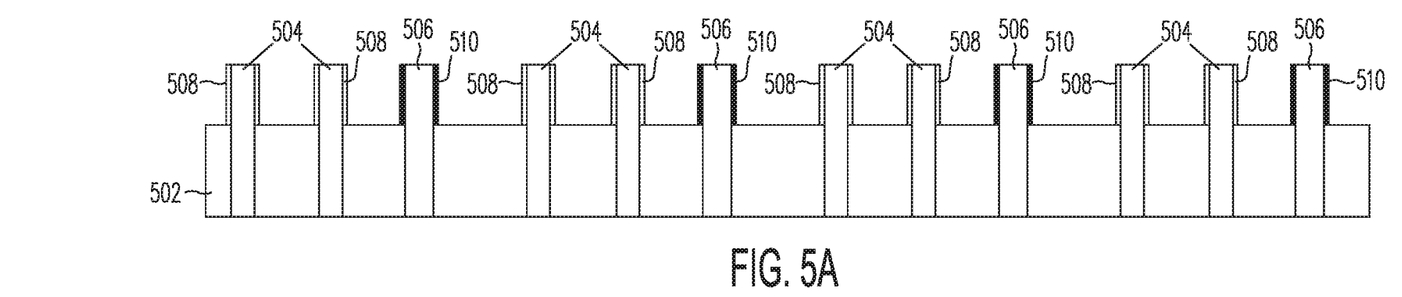
FIGS. 5A through 5I illustrate graphically the process of producing a 3DIC as illustrated in FIG. 4.

FIG. 4 illustrates a process 402 for forming a 3DIC chip according to some embodiments of the present invention. As shown in FIG. 4 and FIG. 5A, in step 402, posts are formed on a silicon die 502. Some of the posts are designated as thermal posts 506 while others are designated as signal posts 504. Thermal posts 506 are used to provide thermal contact while signal posts 504 carry signals between dies 402 of the finished chip. In step 404, posts that are designated as signal posts 504 are coated with an insulator layer 508 and posts designated as thermal posts 506 are coated with a solder layer 510. The insulator layer 508 may, for example, be a diamond-like carbon layer deposited on the signal posts 504.

Figure 3:
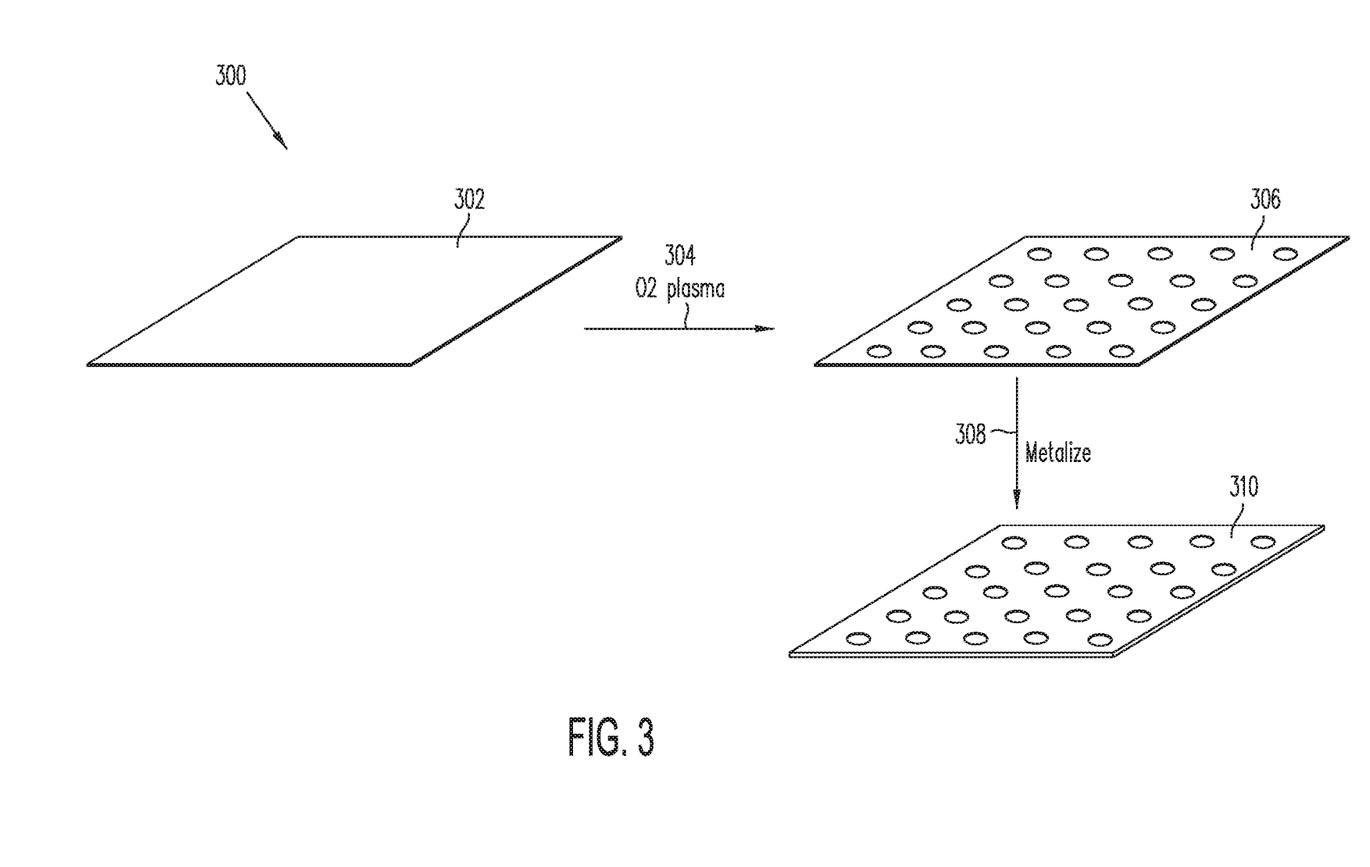
FIG. 3 illustrates patterning of a pyrolytic graphite layer.
Figure 5B:
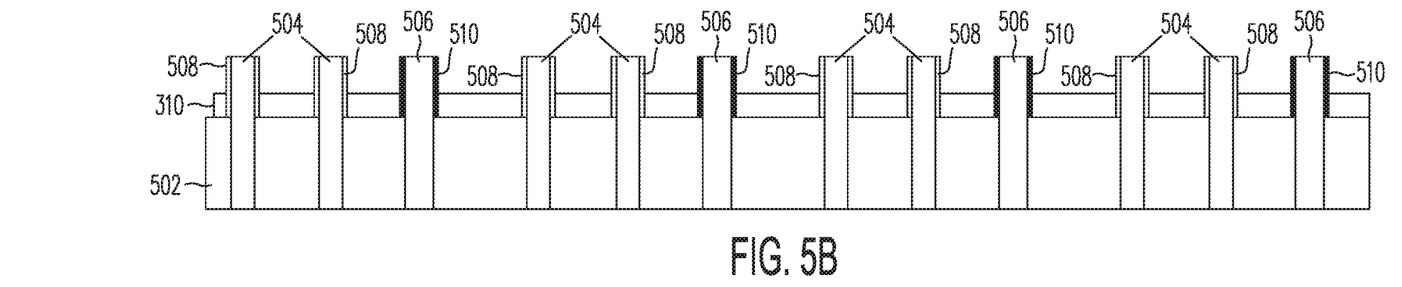

In step 406, as shown in FIG. 5B, the posts 504 and 506 are overlayed with a pre-patterned, solderable thermally conductive layer with adhesive backing 310. Formation of patterned thermally conducting layer 310 is illustrated in FIG. 3. As shown in FIG. 3, a thermally conducting layer 302 can be a pyrolytic graphite layer, can be formed of carbon nanotubes, may be formed of graphene, or may be formed of another material that exhibits high planar thermal conductivity. The thermally conducting layer 302 can be patterned and etched in step 304 to provide a patterned thermally conducting layer 306. The patterned thermally conducting layer 306 can be metalized in step 308 to form the pre-patterned, solderable thermally conducting layer 310. Patterning and etching a pyrolytic graphite sheet, for example, is described, for example, in Xuekun Lu, Hui Huang, Nikolay Nemchuk, and Rodney Ruoff, "Patterning of Highly Oriented Pyrolytic Graphite by Oxygen Plasma Etching," Appl. Phys. Letts., Vol. 75 November 2 (12 Jul. 1999).

Figure 5C:
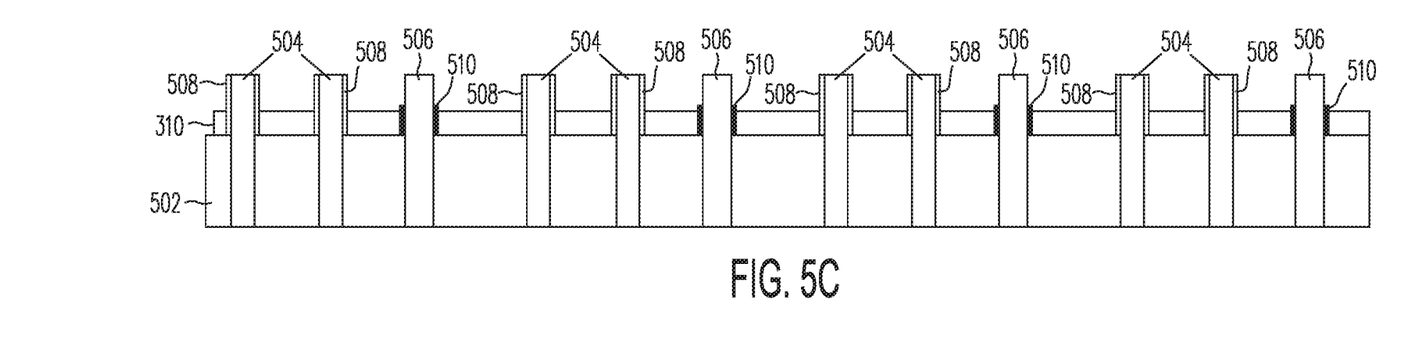

In step 408, solder thermal reflow can be used to thermally couple thermally conducting sheet 310 to the thermal posts. FIG. 5C illustrates the structure after thermal reflow step 408. As shown in FIG. 5C, solder 510 is flowed into contact with graphite sheet 310.

Figure 5D:
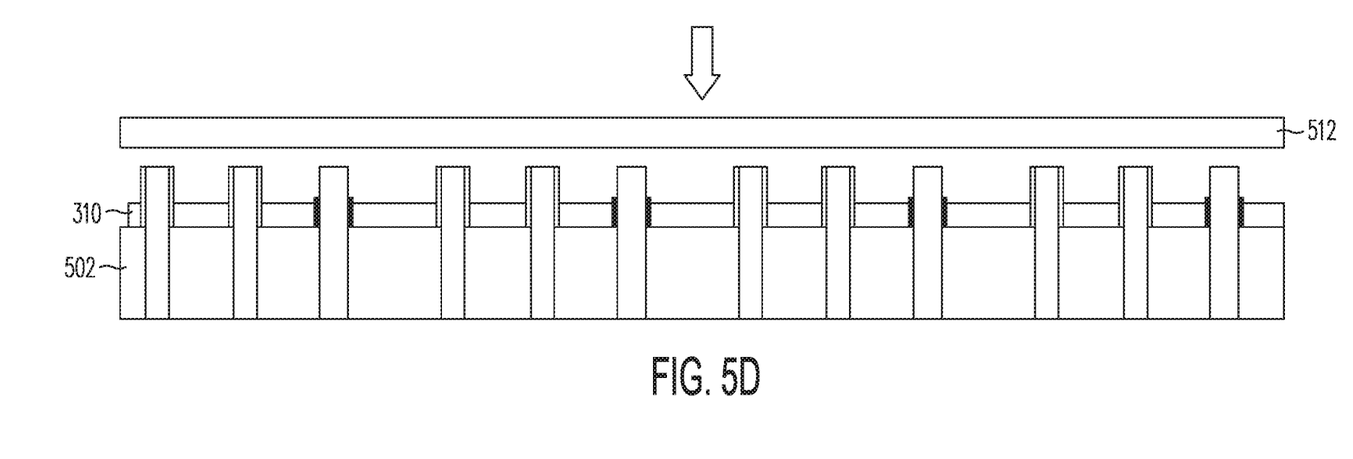
Figure 5E:
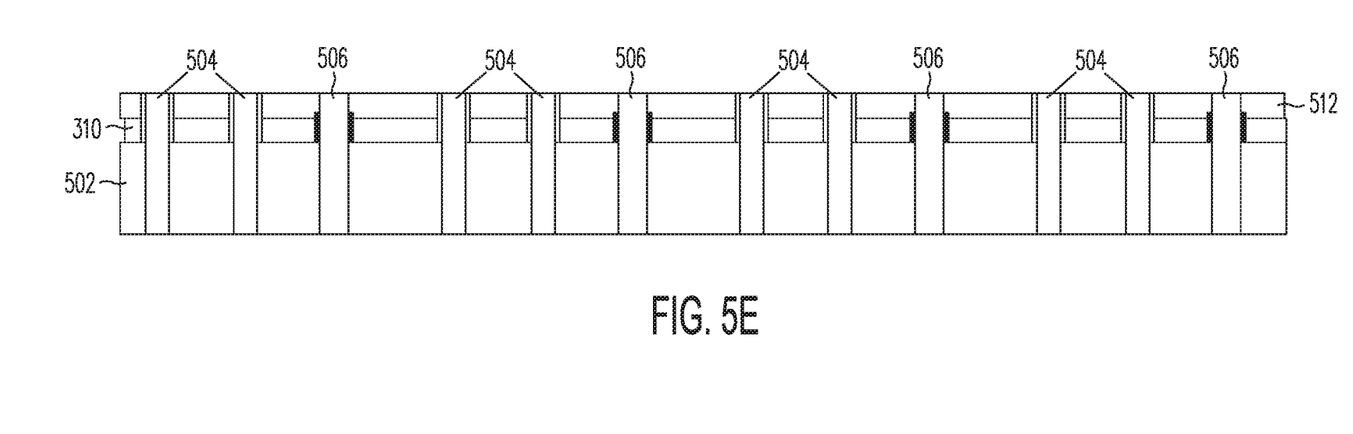

In step 410, as shown in FIG. 5D, a photo-sensitive adhesive sheet 512 can be placed over graphite sheet 310. In step 412, as illustrated in FIG. 5E, the photo-sensitive adhesive sheet 512 can be developed and the exposed surface of posts 504 and 506 cleaned.

Figure 5F:
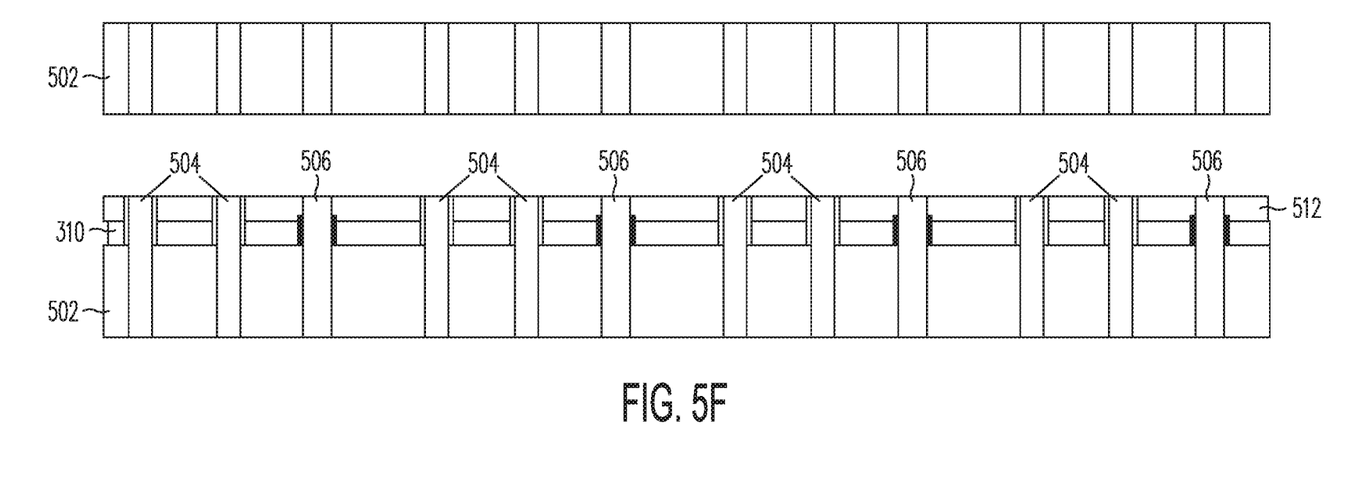
Figure 5G:
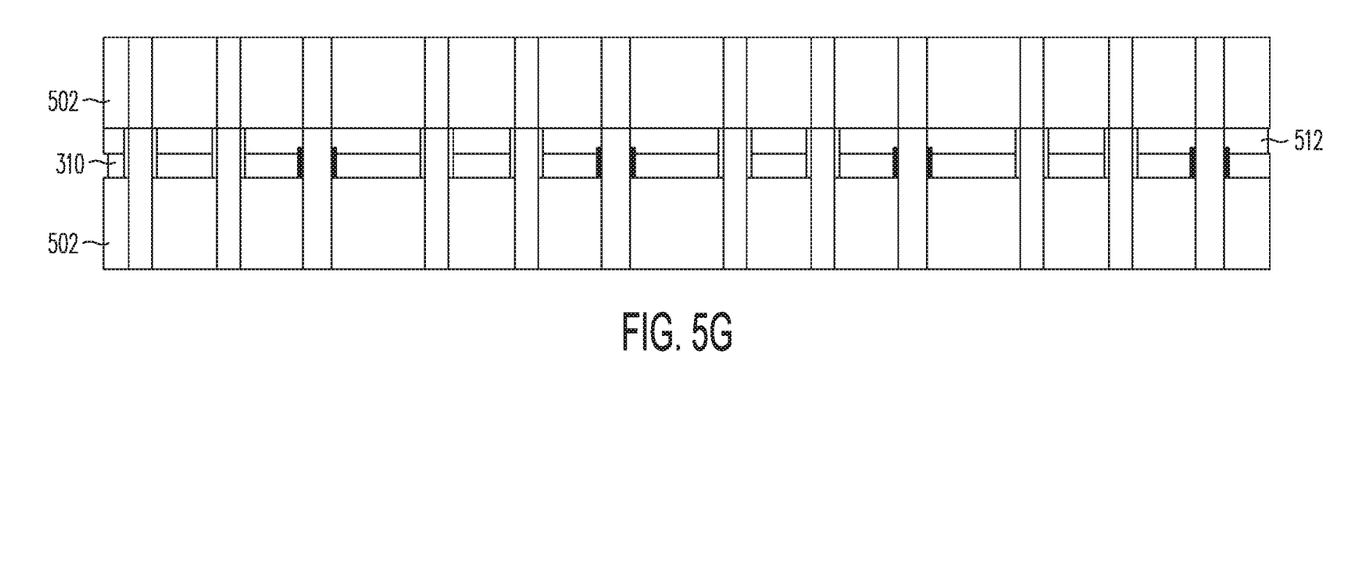

In step 414, as shown in FIG. 5F, a top die 502 can be placed over the photo-sensitive adhesive sheet 512 so that posts 504 and 506 make contact between the two dies 502. In step 416, as show in FIG. 5G, temperature and pressure can be used to bond the metal contacts of top and bottom die together and the adhesive sheet can be cured to fix dies 502 together.

Figure 5H:
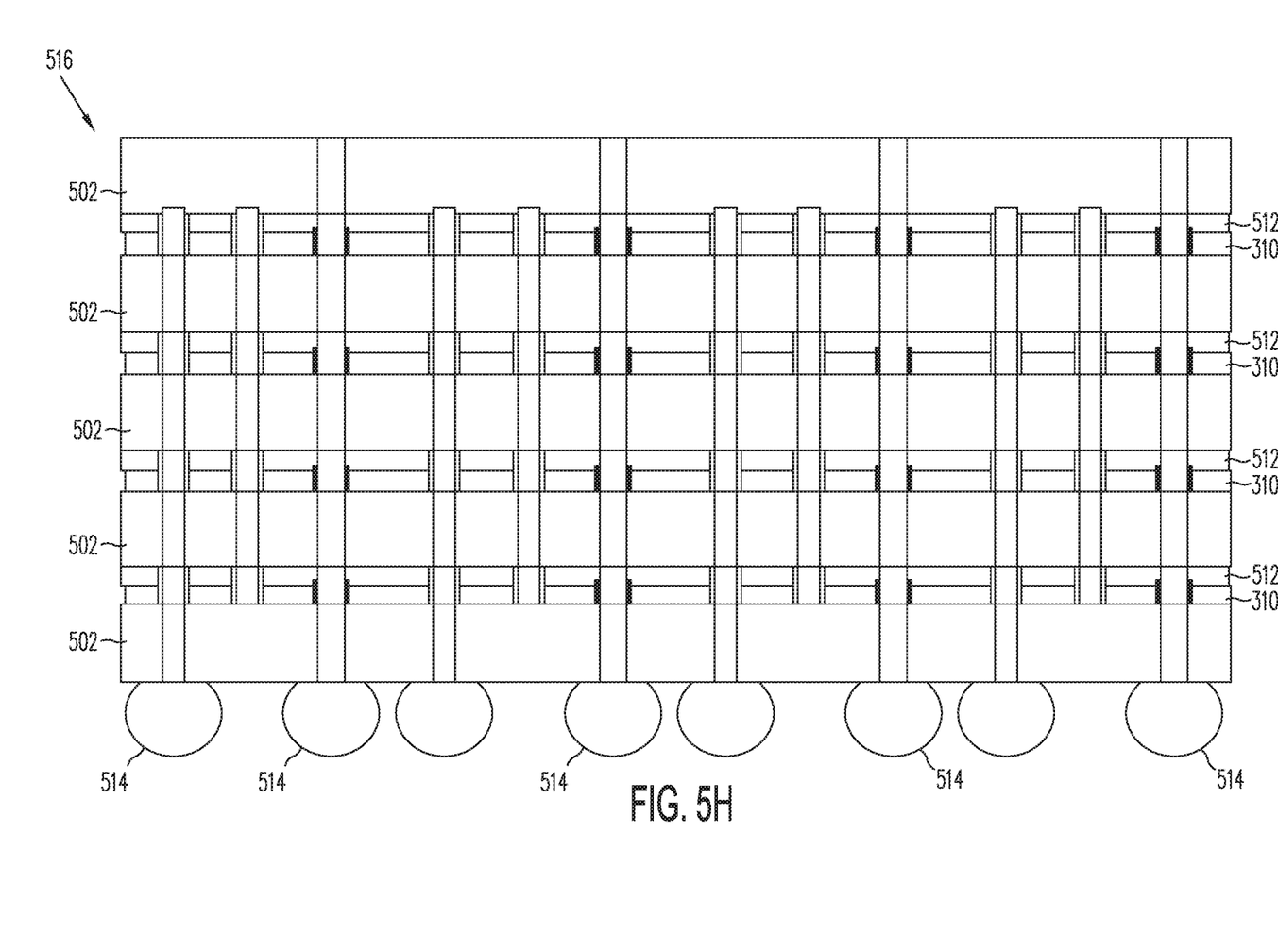

In step 418, if there are more die to be added, process 400 can return to step 402 to add more dies 502. FIG. 5H illustrates a device 516 with multiple stacked dies 502.

In step 420, as is also illustrated in FIG. 5H, solder balls 514 are added to the bottom die 502 for board level attachment.

Figure 5I:
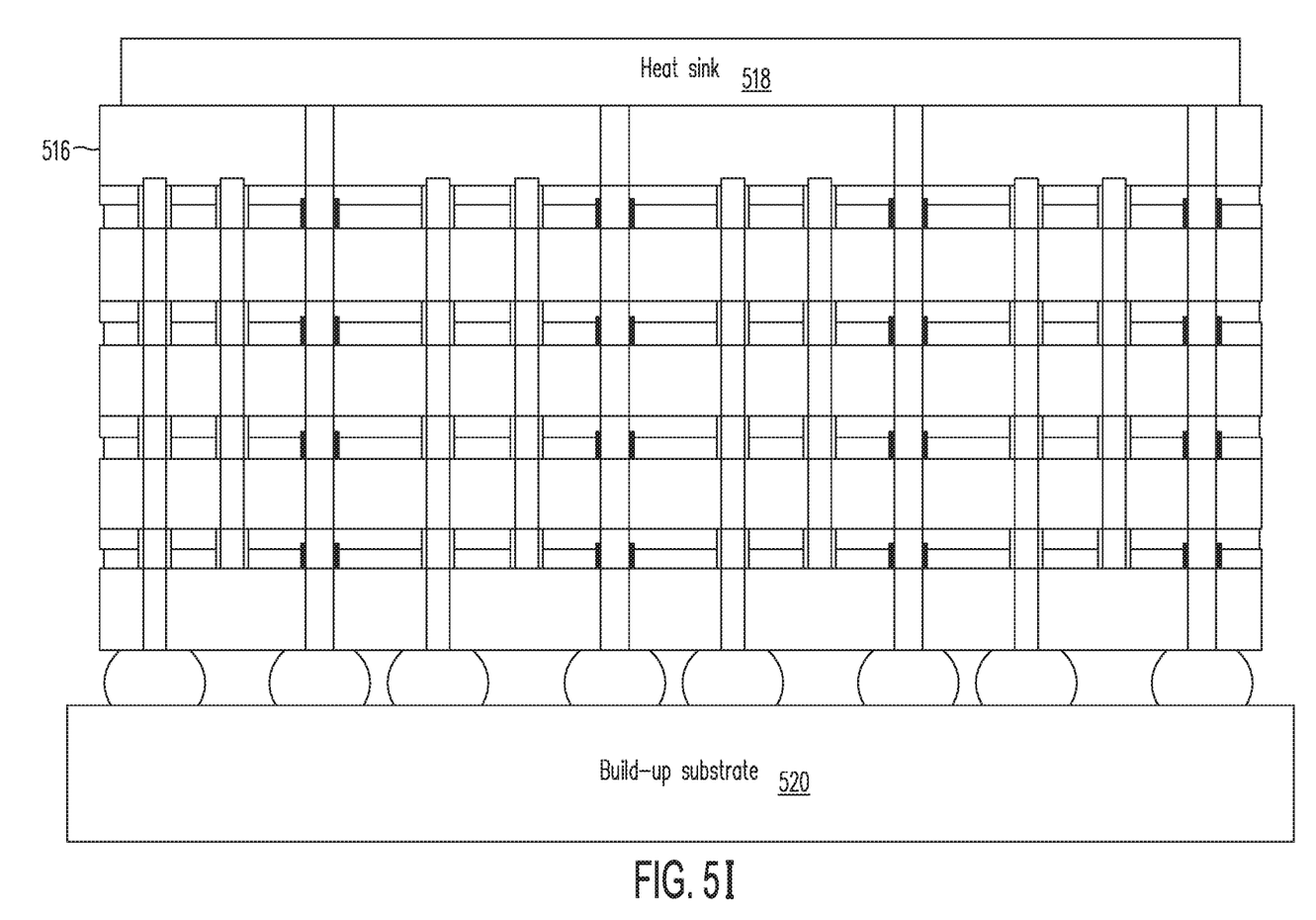

In step 422, as is illustrated in FIG. 5I, device 516 can be mounted on a build-up substrate 520. Further, a heat sink 518 can be coupled to thermal paths formed by posts 506.

In some embodiment, the carbon layer may be ground and the through-silicon-via (TSV) ground electrical pathways may contact the carbon graphite layer and there is no insulating layer between the grounded electrical pass through and the carbon layer. In other embodiments, the carbon thermal layer contacts the barrier layer surrounding the through via electrode.

In some cases, a high power chip may be combined with low power chips in a stack. Direct stacking of low-powered die on top of a high power die may be problematic because the heat generated by the high power die can adversely affect the low powered die. For example, stacking of DRAM on top of a high power logic die may result in the DRAM performance drifting off specification due to thermal problems. Consequently, some embodiments of the present invention may provide thermal spreading for the high power die without providing thermal spreading for the low power die.

Figure 6:
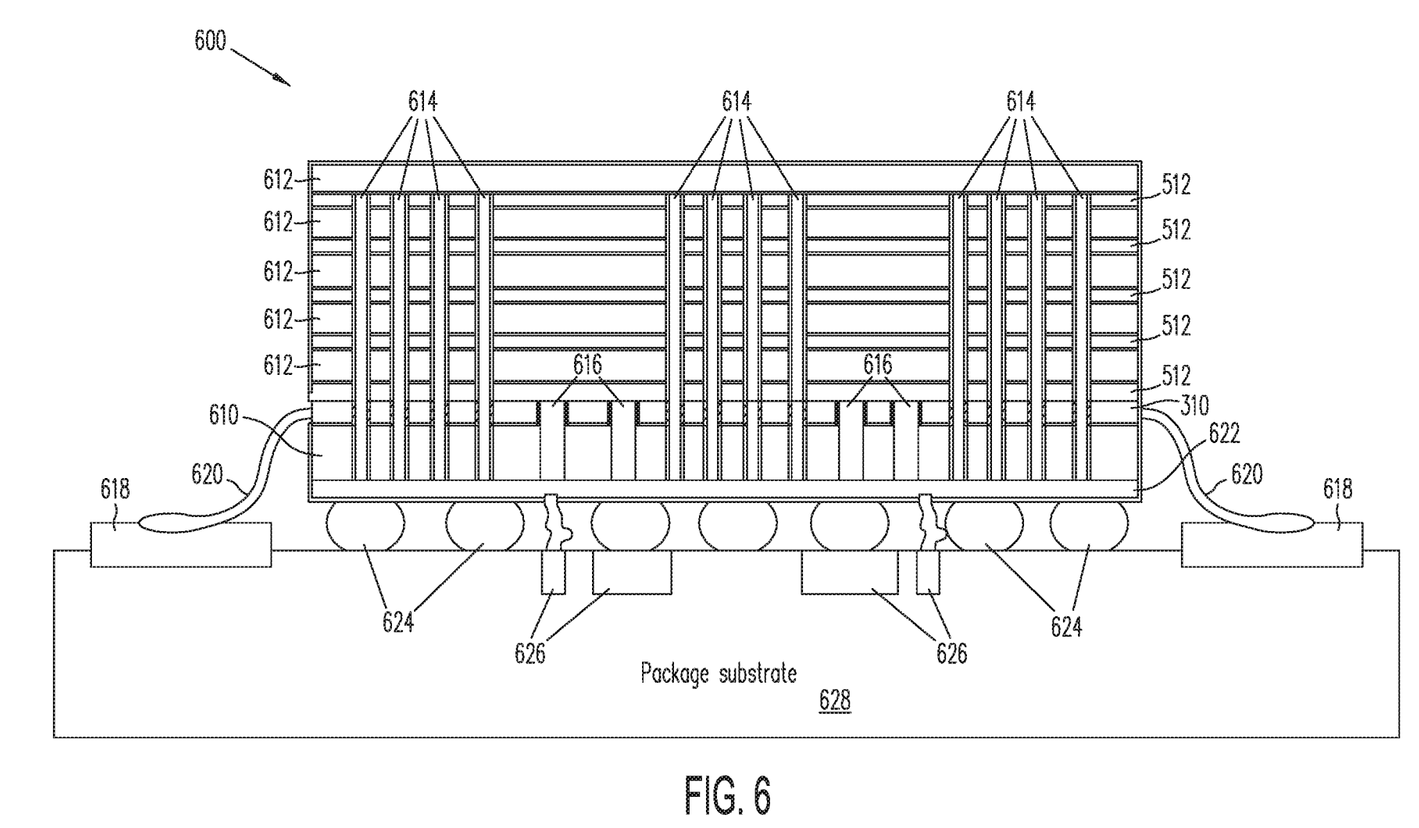
FIG. 6 illustrates an embodiment of a stacked chip.

Such a structure is illustrated in FIG. 6 where stack 600 includes one or more low power die 612 are stacked on a high power chip 610. In some examples, low power die 612 can be DRAM while high power die 610 includes logic circuits for interfacing with the DRAMs on low power die 612. As shown in FIG. 6, low power die 612 and high power die 610 are electrically connected with through signal vias 614. In some embodiments, one or more redistribution layers 622 can electrically connect signal vias 614 with electrical connections 624, which connect to package substrate 628. Each of low power die 612 are separated by an adhesive or underfill layer 512. High power die 610 is first covered by a thermally conducting layer 310. Thermally conducting layer 310 is separated from the first low power die 612 by an adhesive or underfill layer 512. Thermally conducting layer 310 can divert heat from high power die 610 and protects low power die 612 from overheating due to proximity to high power die 610. In some embodiments, more than one high power die can be included in stack 600. In which case, each of the high power die can be associated with a thermal conducting layer as discussed above to direct heat from other low power die in stack 600.

As shown in FIG. 6, thermal conducting layer 310 can be thermally coupled to thermal vias 616 and the heat directed to thermal connections 626 in substrate 628. Further, flexible connections 620 can couple heat from thermal conducting layer 310 to heat sinks 618 mounted on substrate 628.

As is illustrated in FIG. 6, no thermal heat spreading layers like thermal conducting layer 310 are inserted between low power dies 612. Thermally conducting layer 310 between the lowest low power die 612 and high power die 610 serves to reduce hot spots in high power die 610 and the very low thermal conductivity adhesive layer 512 above thermal conducting layer 310 further shields low power die 612 from high power die 610. Thermal vias 616 are terminated in thermally conducting layer 310 and are coupled to substrate 628 through solder balls and compliant thermal paths. Thermal layer 310 can be further coupled to heat sinks 618 through flexible connections 620.

In the preceding specification, various embodiments have been described with reference to the accompanying drawings. It will, however, be evident that various modifications and changes may be made thereto, and additional embodiments may be implemented, without departing from the broader scope of the invention as set for in the claims that follow. The specification and drawings are accordingly to be regarded in an illustrative rather than restrictive sense.

What is claimed is:

1. A device, comprising:
a plurality of die positioned in a stack, each die including a chip, electrical interconnects extending through a thickness of the chip to provide an electrical path from a top side of the chip to a bottom side of the chip, and metal features on the bottom side coupled to the electrical interconnects;
at least one thermally conducting layer coupled between a top side of one of the plurality of die and a bottom side of an adjoining die in the stack;
an adhesive layer bonding the at least one thermally conducting layer to a die of the plurality of die;
an electrically insulating but thermally conducting layer on the at least one thermally conducting layer opposite the adhesive layer; and
a heat sink coupled to the thermally conducting layer.

2. The device of claim 1, wherein the thermally conducting layer is a pyrolytic graphite layer.

3. The device of claim 1, wherein the chip is a silicon chip.

4. The device of claim 1, wherein the metal features are solder balls, solder caps, or pads.

5. The device of claim 1, further including a side electrically insulating but thermally conducting layer extending in the direction of thickness of said dies that contacts each of the electrically insulating but thermally conducting layers and the at least one thermally conducting layer.

6. The device of claim 5, further comprising a metal layer adjacent the electrically insulating but thermally conducting layer.

7. The device of claim 5, further including a substrate, the substrate including heat paths thermally coupled to the side electrically insulating but thermally conducting layer and the metal layer.

8. The device of claim 1, wherein the interconnects form signal posts and thermal posts, the signal posts on the top of each die being electrically isolated from the thermally conducting layer and the thermal posts being directly coupled to the thermally conducting layer.

9. The device of claim 1, wherein the thermally conducting layer is a pyrolytic graphite layer, a layer formed of carbon nanotubes, or a graphene layer.

10. The device of claim 8, wherein metal features of electrically conductive composition are connected to a bottom die of the stack to couple the stack to a substrate.

11. A stacked microelectronic device, comprising:
a plurality of die, each of the die with a thermally conducting sheet on a top side of a silicon chip, and with electrically insulating but thermally conducting material at one or more edges of the thermally conducting sheet;
wherein the die are stacked to form a stack such that the thermally conducting sheet of each of one or more of the die is disposed between the die, at least one die's electrically insulating but thermally conducting material electrically insulating the die's thermally conducting sheet from at least one interconnect that electrically connects the die to an overlying die in the stack;
a substrate onto which the stack of the plurality of die is mounted; and
a heat sink mounted to the stack of the plurality of die opposite the substrate.

12. The stacked microelectronic device of claim 11, further comprising an electrically insulating but thermally conducting layer on a side wall of the stacked plurality of die such that the electrically insulating but thermally conducting layer on the side wall contacts each said thermally conducting sheet in the stack;
wherein the electrically insulating but thermally conducting layer on the side wall connects with a heat path through the substrate.

13. The stacked microelectronic device of claim 12 further including a metal layer over the electrically insulating but thermally conducting layer on the side wall.

14. The stacked microelectronic device of claim 11 wherein at least one said thermally conducting sheet is a pyrolytic graphite sheet.

15. A microelectronic device comprising:
a first integrated circuit with circuitry;
a first layer over the first integrated circuit, with at least one of properties (i) and (ii) being true with regard to a thermal conductivity of the first layer in at least one lateral direction:
(i) the first layer comprises a metal;
(ii) the first layer comprises carbon, and said thermal conductivity is in the at least one lateral direction;
one or more first vias each of which passes through the first layer and exposes a corresponding first region of the circuitry of the first integrated circuit;
a second integrated circuit comprising circuitry and attached to the first integrated circuit, at least part of the first layer lying between the first and second integrated circuits, the circuitry of the second integrated circuit being electrically connected to each first region by a corresponding electrical connection reaching the first region through the corresponding first via; and
an electrically insulating layer between the first layer and the second integrated circuit.

16. The microelectronic device of claim 15 further comprising, between the electrically insulating layer and the second integrated circuit, a conductive feature on each first region, each conductive feature being electrically insulated from the first layer by the electrically insulating layer;
wherein the second integrated circuit is attached to each said conductive feature.

17. The microelectronic device of claim 15 wherein the electrically insulating layer is at least as thermally conducting as diamond-like carbon.

18. The microelectronic device of claim 15 wherein the electrically insulating layer comprises diamond-like carbon.

19. A device, comprising:
a plurality of die positioned in a stack, each die including a chip, electrical interconnects extending through a thickness of the chip to provide an electrical path from a top side of the chip to a bottom side of the chip, and metal features on the bottom side coupled to the electrical interconnects;
at least one thermally conducting layer coupled between a top side of one of the plurality of die and a bottom side of an adjoining die in the stack, wherein the interconnects form signal posts and thermal posts, the signal posts on the top of each die being electrically isolated from the thermally conducting layer and the thermal posts being directly coupled to the thermally conducting layer; and
a heat sink coupled to the thermally conducting layer.

20. A device, comprising:
a plurality of die positioned in a stack, each die including a chip, electrical interconnects extending through a thickness of the chip to provide an electrical path from a top side of the chip to a bottom side of the chip, and metal features on the bottom side coupled to the electrical interconnects;
at least one thermally conducting layer coupled between a top side of one of the plurality of die and a bottom side of an adjoining die in the stack; and
an electrically insulating but thermally conducting layer disposed on a surface of the at least one thermally conducting layer.

* * * * *